United States Patent
Ueki et al.

(10) Patent No.: US 12,189,597 B2
(45) Date of Patent: Jan. 7, 2025

(54) DATA MANAGEMENT SYSTEM, DISCLOSURE SERVER, AND METHOD USED THEREIN

(71) Applicant: TOYOTA JIDOSHA KABUSHIKI KAISHA, Toyota (JP)

(72) Inventors: Tomoyoshi Ueki, Toyota (JP); Yasuhide Kurimoto, Toyota (JP); Masato Hozumi, Mishima (JP); Koji Hetsugi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/977,039

(22) Filed: Oct. 31, 2022

(65) Prior Publication Data

US 2023/0205747 A1    Jun. 29, 2023

(30) Foreign Application Priority Data

Dec. 24, 2021 (JP) .................. 2021-210642

(51) Int. Cl.
*G06F 16/22* (2019.01)
*G06F 16/27* (2019.01)

(52) U.S. Cl.
CPC .......... *G06F 16/2272* (2019.01); *G06F 16/27* (2019.01)

(58) Field of Classification Search
CPC .. G06F 16/2272; G06F 16/2365; G06F 16/27; G06F 16/273; G06F 16/275; G06F 16/278; G06F 21/60; G01R 31/367; G01R 31/392; Y02E 60/10; G06Q 10/06393; G06Q 50/00; G06Q 50/06; H02J 7/005; H04L 63/0428; H04L 67/108
See application file for complete search history.

(56) References Cited

U.S. PATENT DOCUMENTS

| | | | |
|---|---|---|---|
| 10,454,906 B1 * | 10/2019 | Sharfman | H04L 63/0428 |
| 11,130,422 B1 * | 9/2021 | Goldfarb | F03D 9/32 |
| 11,170,366 B2 * | 11/2021 | Snow | G06F 16/1805 |
| 2019/0266146 A1 * | 8/2019 | Rose | G06F 16/215 |
| 2019/0329669 A1 | 10/2019 | Soeda et al. | |
| 2019/0363938 A1 * | 11/2019 | Liebinger Portela | H04L 41/0813 |
| 2020/0200824 A1 * | 6/2020 | Narayanaswami | H04L 67/12 |
| 2022/0113356 A1 * | 4/2022 | Kasselman | H01M 10/4257 |
| 2022/0340039 A1 * | 10/2022 | Unagami | B60L 53/66 |

FOREIGN PATENT DOCUMENTS

| | | |
|---|---|---|
| JP | 2019-192630 A | 10/2019 |
| WO | 2021-064818 A1 | 4/2021 |
| WO | 2021/145360 A1 | 7/2021 |

* cited by examiner

Primary Examiner — Robert W Beausoliel, Jr.
Assistant Examiner — Cheryl M Shechtman
(74) Attorney, Agent, or Firm — Dinsmore & Shohl LLP

(57) ABSTRACT

A data management system includes a data management device and an arithmetic device. The data management device is configured to acquire battery data and store, in a distributed ledger, transaction data including information on the acquired battery data. The arithmetic device is configured to acquire the battery data from the data management device and calculate an index using the battery data and a predetermined arithmetic formula. The arithmetic device is configured to offer the index to a disclosure server.

6 Claims, 11 Drawing Sheets

FIG. 2

BATTERY INFORMATION

| BATTERY ID | VEHICLE ID | TEMPERATURE INFORMATION | SOC INFORMATION | ... |
|---|---|---|---|---|
| B1 | V1 | T1 | SOC1 | ... |

FIG. 4

ARITHMETIC INFORMATION

| BATTERY ID | VEHICLE ID | TEMPERATURE INFORMATION | SOC INFORMATION | ... |
|---|---|---|---|---|
| B1 | V1 | T1 | SOC1 | ... |
|  | V1 | T2 | SOC2 | ... |
|  | ... | ... | ... | ... |
| B2 | V2 | T3 | SOC3 | ... |
|  | V2 | T4 | SOC4 | ... |
|  | ... | ... | ... | ... |
| ... | ... | ... | ... | ... |

FIG. 9

| FIRST LAYER (PUBLIC DATA) | OUTPUT INFORMATION (SOH) |
|---|---|
| SECOND LAYER (DATA FOR SPECIFIC BUSINESS OPERATOR) | BATTERY INFORMATION |
| THIRD LAYER (DATA FOR CERTIFICATION ORGANIZATION CONFIRMATION) | TECHNICAL INFORMATION |

DATA MANAGEMENT SYSTEM, DISCLOSURE SERVER, AND METHOD USED THEREIN

CROSS-REFERENCE TO RELATED APPLICATION

This application claims priority to Japanese Patent Application No. 2021-210642 filed on Dec. 24, 2021, incorporated herein by reference in its entirety.

BACKGROUND

1. Technical Field

The present disclosure relates to a data management system and a disclosure server that manage data using a distributed ledger technique, and to a method used therein.

2. Description of Related Art

WO 2021/064818 discloses a replacement battery system including a management server, a battery station, and an electrified motorcycle using a battery as a drive force source. In the replacement battery system, a fully charged battery is rented out to a user of the electrified motorcycle at the battery station. The management server records charging or discharging of the battery and a value generated by the battery in one cycle of the charging or the discharging in a blockchain network. The management server calculates a future value of the battery from the charging or discharging record, and the value generated by the battery in one cycle of the charging or the discharging.

SUMMARY

However, an index indicating a state of the battery may be required to be disclosed according to a regulation or the like. Here, when disclosing the index, a side that is required to have the index indicating the state of the battery (for example, an automobile manufacturer that provides a vehicle having a battery mounted thereon) may desire to hide information (an arithmetic formula and/or original data of the arithmetic) for calculating the index.

However, when only the index indicating the state of the battery is disclosed, it is difficult to prove that the disclosed index indicating the state of the battery is appropriate and, for example, has not been tampered with. It is desirable to establish a method capable of ensuring a non-tampering property of the disclosed index indicating the state of the battery while hiding the information (the arithmetic formula and/or the original data of the arithmetic) for calculating the index indicating the state of the battery.

The present disclosure provides a technique that ensures, when the index indicating the state of the battery is disclosed, a non-tampering property of the disclosed index indicating a state of a battery while hiding information for calculating the index indicating the state of the battery.

A data management system according to a first aspect of the present disclosure offers an index indicating a state of a battery to a disclosure server that discloses the index. The data management system includes a data management device configured to acquire battery data and store, in a distributed ledger, transaction data including information on the acquired battery data, and an arithmetic device configured to acquire the battery data from the data management device and calculate the index using the battery data and a predetermined arithmetic formula. The arithmetic device is configured to offer the index to the disclosure server.

With the above configuration, the arithmetic device offers the index indicating the state of the battery to the disclosure server. The battery data and the predetermined arithmetic formula, which are pieces of information for calculating the index indicating the state of the battery, are not offered to the disclosure server, and thus it is possible to hide the battery data and the predetermined arithmetic formula from the disclosure server. Further, for example, when the disclosed index indicating the state of the battery and one (for example, the battery data which is the original data of the arithmetic) of the battery data and the predetermined arithmetic formula are disclosed, the other (for example, an arithmetic formula for deriving the index indicating the state of the battery) may be inferred. By offering the index indicating the state of the battery to the disclosure server, that is, by offering neither the battery data nor the predetermined arithmetic formula to the disclosure server, it is possible to more appropriately hide the information for calculating the index indicating the state of the battery from the disclosure server. Further, the data management device stores the transaction data including the information on the battery data in the distributed ledger. By doing so, when the battery data is tampered with, it is possible to detect the tampering. As such, by managing the battery data using a distributed ledger technique, it is possible to ensure a non-tampering property of the battery data. Therefore, it is possible to improve reliability of the index indicating the state of the battery that is calculated using the battery data.

In the first aspect, the data management server may further include a storage device configured to accumulate the battery data in time series. The arithmetic device may calculate the index using the battery data accumulated in the storage device and the predetermined arithmetic formula.

In the first aspect, the information on the battery data may be a hash value obtained by hashing the battery data.

With the above configuration, the distributed ledger stores the hash value of the battery data. The battery data itself is not stored in the distributed ledger, and thus it is possible to restrict the battery data from being disclosed to another device (a node) having a distributed ledger. Therefore, it is possible to store the hash value of the battery data in the distributed ledger and hide the battery data itself from another node while ensuring the non-tampering property of the battery data. Further, the hash value of the battery data has a smaller data capacity than the battery data. Therefore, it is possible to reduce the data capacity stored in the distributed ledger as compared with the case where the transaction data including the battery data itself is stored in the distributed ledger.

In the first aspect, the arithmetic device may compare, upon acquiring the battery data from the data management device, the value obtained by hashing the acquired battery data with the information on the battery data stored in the distributed ledger.

When the battery data is tampered with, the hash value of the tampered battery data does not match the information (the hash value) on the battery data stored in the distributed ledger. With the above configuration, by comparing the hash value of the battery data acquired from the data management device with the information (the hash value) on the battery data stored in the distributed ledger, it is possible to detect the tampering of the battery data.

In the first aspect, the data management system may further include the disclosure server.

A disclosure server according to a second aspect of the present disclosure manages battery data using a distributed ledger technique, and discloses an index indicating a state of a battery. The disclosure server includes a storage device having a storage area including a first layer that stores disclosable data and a second layer that stores hidden data, and a control device. The control device is configured to acquire the battery data, store, in a distributed ledger, transaction data including information on the battery data, calculate the index using the battery data and a predetermined arithmetic formula, store the index in the first layer, and store the battery data and the predetermined arithmetic formula in the second layer.

With the above configuration, the storage device has the storage area including the first layer that stores the disclosable data and the second layer that stores the hidden data. The index indicating the state of the battery is stored in the first layer and the battery data and the predetermined arithmetic formula are stored in the second layer, respectively. By appropriately disclosing the index indicating the state of the battery and storing the battery data and the predetermined arithmetic formula in the second layer, it is possible to appropriately hide the battery data and the predetermined arithmetic formula. Further, the disclosure server stores the transaction data including the information on the battery data in the distributed ledger. By doing so, when the battery data is tampered with, it is possible to detect the tampering. As such, by managing the battery data using a distributed ledger technique, it is possible to ensure a non-tampering property of the battery data.

In the second aspect, the storage device may store the battery data in the second layer in time series. The control device may calculate the index using the battery data and the predetermined arithmetic formula accumulated in the second layer.

In the second aspect, the information on the battery data may be a hash value obtained by hashing the battery data.

A method according to a third aspect of the present disclosure is executed by a processor and offers an index indicating a state of a battery to a disclosure server that discloses the index. The method includes acquiring, by the processor, battery data, storing, by the processor, transaction data including information on the acquired battery data in a distributed ledger, calculating, by the processor, the index using the battery data and the predetermined arithmetic formula, and offering, by the processor, the index to the disclosure server.

A disclosure method according to a fourth aspect of the present disclosure is executed by a disclosure server that manages battery data using a distributed ledger technique and discloses an index indicating a state of a battery. The disclosure server includes a storage device and a control device. The storage device has a storage area including a first layer that stores disclosable data and a second layer that stores hidden data. The disclosure method includes acquiring, by the control device, the battery data, storing, by the control device, in a distributed ledger, transaction data including information on the battery data, calculating, by the control device, the index using the battery data and a predetermined arithmetic formula, storing, by the control device, the index in the first layer, and storing, by the control device, the battery data and the predetermined arithmetic formula in the second layer.

A non-transitory storage medium according to a fifth aspect of the present disclosure stores instructions that are executable by one or more processors and that cause the one or more processors to execute functions for offering an index indicating a state of a battery to a disclosure server that discloses the index. The functions include acquiring battery data, storing transaction data including information on the acquired battery data in a distributed ledger, calculating the index using the battery data and a predetermined arithmetic formula, and offering the index to the disclosure server.

A non-transitory storage medium according to a sixth aspect of the present disclosure stores instructions that cause a disclosure server to execute functions. The disclosure server manages battery data using a distributed ledger technique, discloses an index indicating a state of a battery, and includes a storage device and a control device. The storage device has a storage area including a first layer that stores disclosable data and a second layer that stores hidden data. The functions include acquiring battery data, storing transaction data including information on the battery data in a distributed ledger, calculating the index using the battery data and a predetermined arithmetic formula, storing the index in the first layer, and storing the battery data and the predetermined arithmetic formula in the second layer.

With each aspect of the present disclosure, it is possible to ensure, when disclosing an index indicating a state of a battery, a non-tampering property of the disclosed index indicating a state of a battery while hiding information for calculating the index indicating the state of the battery.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 2 is a diagram for describing an example of battery information;

FIG. 4 is a diagram for describing an example of arithmetic information;

FIG. 9 is a diagram schematically illustrating a storage area of a storage device;

DETAILED DESCRIPTION OF EMBODIMENTS

Figure 1:
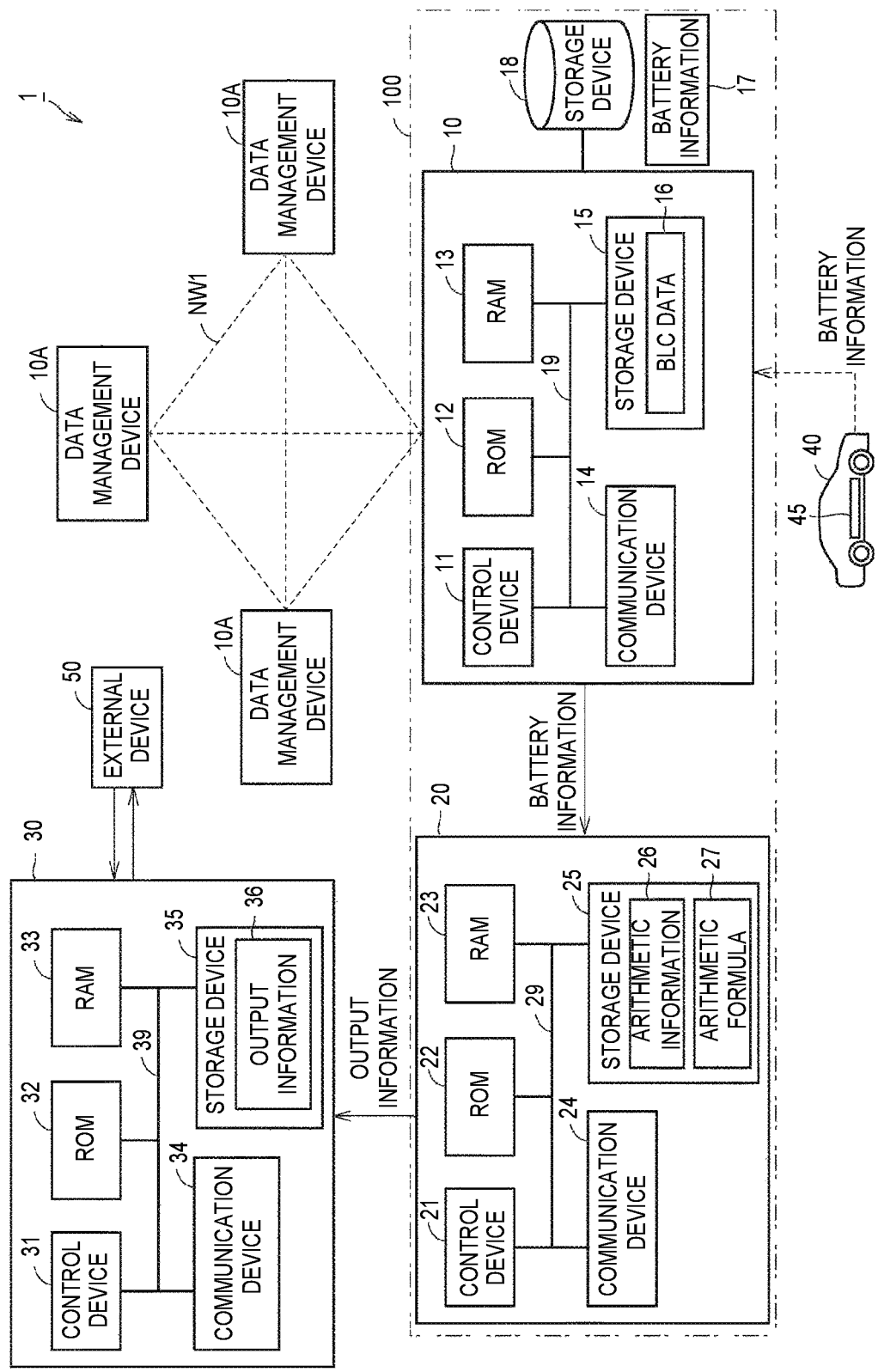
FIG. 1 is a diagram illustrating a schematic configuration of a data management system according to a first embodiment.

Hereinafter, embodiments of the present disclosure will be described in detail with reference to drawings. The same or corresponding parts in the drawings are denoted by the same reference signs, and description thereof will not be repeated.

First Embodiment

FIG. 1 is a diagram illustrating a schematic configuration of a data management system 1 according to a first embodiment. The data management system 1 according to the first embodiment discloses an index indicating a state of a battery mounted on a vehicle. It may be requested that an index indicating the battery state be disclosed according to a regulation or the like. The data management system 1 according to the first embodiment is configured to be capable of responding to such a request.

The data management system 1 manages an index indicating a battery state for each battery ID attached to a battery, and discloses the index indicating the battery state in response to a request from the outside. In the first embodiment, an example where the index indicating the battery state is a state of health (SOH) will be described. The SOH is a value indicating a deteriorating state of a battery. Data managed by the data management system 1 is not limited to the index indicating the battery state, and may be various pieces of data.

The data management system 1 includes a disclosure server 30 and a data management server 100. The disclosure server 30 discloses information (the SOH in the first embodiment) that is obliged to be disclosed according to a regulation or the like. Specifically, the disclosure server 30 stores the SOH for each battery ID, and discloses the SOH in response to a disclosure request that designates the battery ID, from an external device 50. The disclosure server 30 belongs to, for example, a country or an organization authenticated by the country.

The data management server 100 belongs to a company A, which is a vehicle manufacturer. The data management server 100 receives information on an in-vehicle battery 45 from a vehicle 40 (details will be described below) offered from the company A, and calculates the SOH of the battery 45. Then, the data management server 100 transmits the calculated SOH to the disclosure server 30. FIG. 1 illustrates one vehicle 40, but the number of the vehicles 40 may be plural.

There is a request to hide information that is not obliged to be disclosed, such as an arithmetic formula for calculating the SOH, from outside of the company. In the data management system 1 according to the first embodiment, the data management server 100 is provided such that the information on the battery 45 from the vehicle 40 is not directly input to the disclosure server 30, and only the SOH, which is the information obliged to be disclosed according to the regulation or the like is transmitted from the data management server 100 to the disclosure server 30. As such, it is possible to hide the arithmetic formula for calculating the SOH or the like in the company A while appropriately disclosing the SOH. Hereinafter, a configuration of each server will be specifically described.

Data Management Server

The data management server 100 includes a data management device 10 and an arithmetic device 20. In the first embodiment, the configuration in which the data management device 10 and the arithmetic device 20 are separately provided will be described, but it is also possible to provide one device having functions of the data management device 10 and the arithmetic device 20.

Data Management Device

The data management device 10 includes a control device 11, a read-only memory (ROM) 12, a random access memory (RAM) 13, a communication device 14, and a storage device 15. The control device 11, the ROM 12, the RAM 13, the communication device 14, and the storage device 15 are connected to the bus 19. Further, the storage device 18 is communicably connected to the data management device 10. Further, as details will be described below, blockchain-based software is installed in the data management device 10, and the data management device 10 functions as a node in the blockchain network when the installed blockchain-based software functions.

The control device 11 is composed of, for example, an integrated circuit including a central processing unit (CPU). The control device 11 develops, in the RAM 13, various programs stored in the ROM 12 and executes them. The various programs include an operating system and the like. The RAM 13 functions as a working memory and temporarily stores various pieces of data needed for executing the various programs.

The communication device 14 is configured to be communicable with the vehicle 40. Further, the communication device 14 is configured to be communicable with the arithmetic device 20. Communication between the communication device 14, and the vehicle 40 or the arithmetic device 20 is executed using, for example, the Internet, a wide area network (WAN), a local area network (LAN), Ethernet® network, a public network, a private network, a wired network, a wireless network, or a combination of these.

The vehicle 40 may be, for example, a vehicle offered by the company A, which is a vehicle manufacturer. The vehicle 40 is a battery electric vehicle having a battery 45 mounted thereon as its drive force source. The vehicle 40 is a vehicle having a battery 45 mounted thereon, and may be, for example, a plug-in hybrid electric vehicle, a hybrid electric vehicle, or a fuel cell electric vehicle.

The vehicle 40 transmits information of the battery 45 (hereinafter, also referred to as "battery information") 17 to the data management device 10. For example, the vehicle 40 transmits the battery information 17 to the data management device 10 at every predetermined cycle set in advance. The vehicle 40 may be configured to transmit the battery information 17 at every predetermined cycle regardless of a start-up time and a sleep time, or may accumulate the battery information 17 therein during the sleep time, and collect and transmit the battery information 17 accumulated during the sleep time at the start-up time. In the first embodiment, as an example, it is assumed that the vehicle 40 transmits the battery information 17 at every predetermined cycle regardless of the startup time and the sleep time.

The control device 11 stores, in the storage device 18, the battery information 17 received from the vehicle 40 via the communication device 14. The storage device 18 stores the newly received battery information 17 according to a control signal from the data management device 10 (the control device 11). The storage device 18 stores, for example, the battery information 17 in time series for each battery ID included in the battery information 17. The storage device 18 can also be provided as a storage device in the data management device 10. Further, the control device 11 transmits the battery information 17 to the arithmetic device 20 via the communication device 14.

FIG. 2 is a diagram for describing an example of the battery information 17. The battery information 17 includes a battery ID, a vehicle ID, temperature information, and state-of-charge (SOC) information. Information included in the battery information 17 is not limited to the above information, and may include various pieces of other information on the battery 45.

The battery ID is identification information for identifying the battery 45. The battery ID is allocated to the battery 45 at a time of, for example, manufacturing the battery 45.

The vehicle ID is identification information for identifying the vehicle 40. The vehicle ID is allocated to the vehicle 40 at a time of, for example, manufacturing the vehicle 40.

The battery information 17 includes the vehicle ID of the vehicle 40 having the battery 45 mounted thereon.

Temperature information indicates a temperature of the battery 45. The temperature information indicates, for example, the temperature of the battery 45 at a time at which the vehicle 40 creates the battery information 17.

SOC information indicates an SOC of the battery 45. The SOC information indicates, for example, the SOC of the battery 45 at the time at which the vehicle 40 creates the battery information 17.

With reference to FIG. 1 again, the data management device 10 and three data management devices 10A belonging to another company different from the company A form a blockchain network NW1. In the same manner as in the data management device 10, blockchain-based software is installed in each of the three data management devices 10A. The three data management devices 10A belong to a company B, a company C, and a company D, respectively. The company B, the company C, and the company D are supplier manufacturers that supply components and the like to, for example, the company A. The company B, the company C, and the company D are not limited to the above-described company categories. For example, the company B, the company C, and the company D may be vehicle manufacturers.

In the first embodiment, each of the data management devices 10, 10A manages data by a distributed ledger technique using a blockchain. Each of the data management devices 10, 10A stores a distributed ledger (hereinafter, also referred to as "BLC data") 16 using a blockchain. The BLC data 16 stores information including a hash value of the battery information 17 transmitted by the data management device 10 to the blockchain network NW1 from a start of an operation of the data management system 1 to the present. Further, the BLC data 16 stores information including hash values of various pieces of information on the battery 45 transmitted by the data management device 10A to the blockchain network NW1 from the start of an operation of the data management system 1 to the present. The various pieces of information on the battery 45 include, for example, composition information of the battery 45, information of each component composing the battery 45, disassembly information of the battery 45, and/or technical information (a test result or a test report at the time of manufacturing the battery 45). When the company B, the company C, and the company D are vehicle manufacturers, in the same manner as the data management device 10, each of the data management devices 10A transmits information including a hash value of battery information of a vehicle offered by the company to the blockchain network NW1. Details of the BLC data 16 will be described below. In the first embodiment, an example where four data management devices 10, 10A form the blockchain network NW1 is described, but the number of data management devices that form the blockchain network NW1 is arbitrary. For example, it may be lower than 4, or equal to or higher than 5.

The ROM 12 stores blockchain-based software. The control device 11 functions as a node in the blockchain network NW1 by executing the blockchain-based software stored in the ROM 12.

The storage device 15 includes, for example, a storage medium, such as a hard disk or a flash memory. The storage device 15 stores the BLC data 16. A place in which the BLC data 16 is stored is not limited to the storage device 15, and the BLC data 16 may be stored in the ROM 12 or the storage device 18.

Further, the storage device 15 stores a private key and a public key generated by the control device 11. The storage device 15 may store an electronic certificate issued by an authentication authority (not shown). The authentication authority is an authentication organization that issues an electronic certificate. An applicant (the data management device 10 in the first embodiment) for the electronic certificate generates the private key and the public key, and transmits the generated public key to the authentication authority. The authentication authority generates the electronic certificate for the public key received from the applicant and issues the electronic certificate to the applicant. Alternatively, the authentication authority may generate the private key, the public key, and the electronic certificate in response to a request from the applicant (the data management device 10 in the first embodiment), and issue these to the applicant. The authentication authority issues, for example, the electronic certificate including information on the public key. The control device 11 executes processing for applying for and acquiring the electronic certificate when, for example, participating in the blockchain network NW1 for the first time. Further, the storage device 15 stores the electronic certificate of the data management device 10A that forms the blockchain network NW1. A place in which the private key, the public key, the electronic certificate, and the electronic certificate of the data management device 10A are stored is not limited to the storage device 15, and they may be stored in the ROM 12 or the storage device 18.

Upon acquiring the battery information 17 from the vehicle 40, the control device 11 stores the battery information 17 in the storage device 18 and generates a hash value of the battery information 17. The hash value is a numerical value obtained as a result of hashing data (the battery information 17) using a hash function. The control device 11 generates transaction data (described below) including the generated hash value, and transmits the generated transaction data to the blockchain network NW1.

BLC Data

Figure 3:
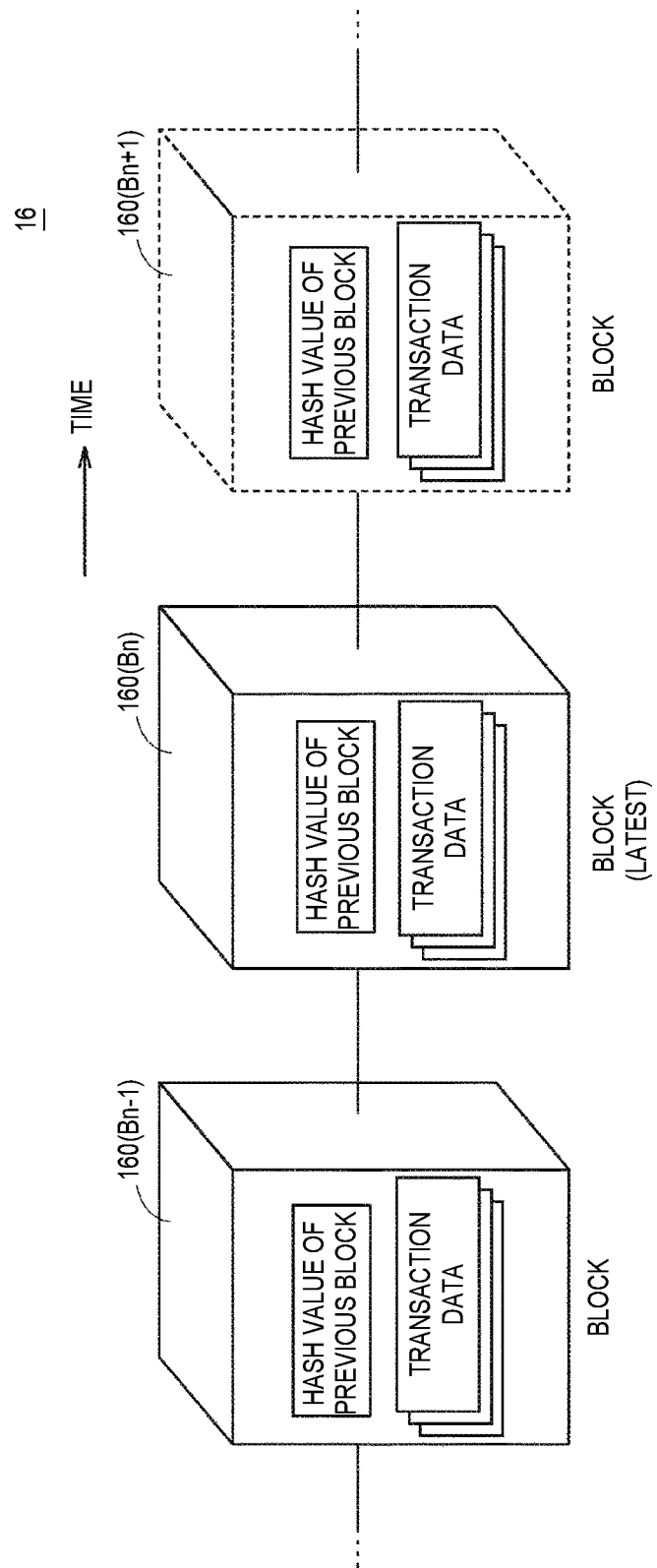
FIG. 3 is a diagram for describing an example of BLC data.

FIG. 3 is a diagram for describing an example of the BLC data 16. As illustrated in FIG. 3, the BLC data 16 is composed of a plurality of blocks 160 in a chain. Each of the blocks 160 includes the transaction data including the hash value of the battery information 17 and the like. The BLC data 16 stores a history of recording the battery information 17 from the start of the operation of the data management system 1 to the present.

The BLC data 16 is stored in all the data management devices 10, 10A that form the blockchain network NW1. As such, even when the BLC data 16 of the data management device 10 is tampered with by a certain user, the tampering is restricted based on the BLC data 16 of the other plurality of data management devices 10A.

Specifically, upon receiving the new battery information 17 from the vehicle 40, the data management device 10 stores the battery information 17 in the storage device 18 and generates the data of transaction (the transaction data) indicating the processing. The control device 11 hashes the battery information 17 received from the vehicle 40 using the hash function, and generates the transaction data including a numerical value (the hash value) obtained as a result of the hashing. The control device 11 transmits the generated transaction data to the blockchain network NW1 via the communication device 14. The transaction data is collected into a new block 160(Bn+1). Then, when a certain condition is satisfied, the new block 160(Bn+1) is added to the BLC data 16.

The transaction data is not recognized as valid only by flowing to the blockchain network NW1. The transaction data becomes valid for the first time when it is added to the BLC data 16 held in each of the data management devices 10, 10A. Unauthenticated transaction data is collected into a new block 160(Bn+1) and the new block 160(Bn+1) is added to the BLC data 16 by, for example, mining processing referred to as proof of work (POW).

The POW is a mechanism in which a plurality of nodes (the data management devices 10, 10A) competes therebetween for an addition of the new block 160(Bn+1). A node that participates in the POW is generally referred to as a minor. A minor that generates the new block 160(Bn+1) earliest may be given a reward. By a consensus-building algorithm using such a mechanism, tamper resistance of the BLC data 16 is secured.

The consensus-building algorithm is not limited to the POW. As the consensus-building algorithm, for example, proof of stake (POS) or practical Byzantine fault tolerance (PBFT) can be employed.

Transaction Data

The transaction data may include, for example, a transaction ID for specifying the transaction data, a hash value of the battery information 17, a battery ID corresponding to the battery information 17, time information for broadcasting the transaction data to the blockchain network NW1 (transmitting the transaction data to the blockchain network NW1), transmitter information of the transaction data, and an electronic signature. The time information included in the transaction data may indicate occurrence time of processing (for example, processing for recording the battery information 17 in the storage device 18) corresponding to the transaction data.

The transmitter information of the transaction data may, for example, the company A when the transaction data has been transmitted by the data management device 10 to the blockchain network NW1. In more detail, the transmitter information of the transaction data may indicate a division (one part of the company A) that has executed the operation of transmitting the transaction data to the blockchain network NW1, or may indicate an individual (an employee of the company A) who has executed the operation of transmitting the transaction data to the blockchain network NW1.

As above, by storing the hash value of the battery information 17 in the BLC data 16 and managing it, it is possible to improve the tamper resistance of the battery information 17.

Arithmetic Device

With reference to FIG. 1 again, the arithmetic device 20 includes a control device 21, a ROM 22, a RAM 23, a communication device 24, and a storage device 25. The control device 21, the ROM 22, the RAM 23, the communication device 24, and the storage device 25 are connected to the bus 29.

The control device 21 is composed of, for example, an integrated circuit including a CPU. The control device 21 develops, in the RAM 23, various programs stored in the ROM 22 and executes them. The various programs include an operating system and the like. The RAM 23 functions as a working memory and temporarily stores various pieces of data needed for executing the various programs.

The communication device 24 is configured to be communicable with the data management device 10. Further, the communication device 24 is configured to be communicable with the disclosure server 30. Communication between the communication device 24, and the data management device 10 or the disclosure server 30 is executed using, for example, the Internet, a WAN, a LAN, Ethernet® network, a public network, a private network, a wired network, a wireless network, or a combination of these.

The storage device 25 includes, for example, a storage medium, such as a hard disk or a flash memory. The storage device 25 stores arithmetic information 26 and an arithmetic formula 27. A place in which the arithmetic information 26 and the arithmetic formula 27 are stored is not limited to the storage device 25, and may be stored in, for example, the ROM 22.

The control device 21 receives the battery information 17 from the data management device 10 via the communication device 24. The arithmetic information 26 is information in which the battery information 17 is accumulated in time series for each battery ID. The arithmetic formula 27 is a formula for deriving the SOH using the arithmetic information 26.

FIG. 4 is a diagram for describing an example of the arithmetic information 26. As illustrated in FIG. 4, the arithmetic information 26 is composed by accumulating the battery information 17 for each battery ID. Further, the battery information 17 is accumulated in time series. For example, when the battery information 17 indicating the battery ID of B1 is newly received, the battery information 17 is accumulated in the arithmetic information 26 as latest information of the battery ID of B 1.

With reference to FIG. 1 again, the control device 21 calculates the SOH for each battery ID (that is, for each battery) using the arithmetic information 26 and the arithmetic formula 27. Here, it is assumed that the SOH of the battery 45 is calculated.

The arithmetic formula 27 includes, for example, a function f (TB, TIME1) of a battery temperature and time and a function f (SOC, TIME2) of the SOC and time, and is represented by, for example, the following equation (1):

$$SOH=1-\{\!f(TB,TIME1)dTB+\!f(SOC,TIME2)dSOC\} \quad (1)$$

TB is the battery temperature, and TIME1 is a time during which a battery is maintained at the battery temperature TB. TIME2 is a time during which a battery is maintained at the SOC.

As described above, the temperature information and the SOC information included in the battery information 17 are acquired by the vehicle 40 at every predetermined cycle. Therefore, from the arithmetic information 26 in which the battery information 17 is accumulated in time series, it is possible to estimate the time TIME1 during which the battery 45 is maintained at a certain temperature and the time TIME2 during which the battery 45 is maintained at a certain SOC.

The arithmetic formula 27 for deriving the SOH is not limited to the above equation (1). For example, a function of a charging current value and time, and/or a function of a discharging current value and time may be further used. Further, the arithmetic formula 27 may be prepared for each type of battery specified by, for example, a model number or the like. In this case, for example, the battery ID may be associated with the arithmetic formula 27 in advance, and the arithmetic formula 27 is specified based on the battery ID.

Upon calculating the SOH of the battery 45, the control device 21 transmits the output information 36 including the calculated SOH to the disclosure server 30 via the communication device 24. The output information 36 includes information on the battery ID and the SOH of the battery 45.

The battery information 17 is also accumulated in time series for each battery ID in the storage device 18 connected to the data management device 10. Therefore, without storing the arithmetic information 26, the arithmetic device 20 may be configured to acquire data corresponding to the arithmetic information 26 from the data management device 10 and calculate the SOH each time the arithmetic of the SOH is executed.

Disclosure Server

The disclosure server 30 includes a control device 31, a ROM 32, a RAM 33, a communication device 34, and a storage device 35. The control device 31, the ROM 32, the RAM 33, the communication device 34, and the storage device 35 are connected to the bus 39.

The control device 31 is composed of, for example, an integrated circuit including a CPU. The control device 31 develops, in the RAM 33, various programs stored in the ROM 32 and executes them. The various programs include an operating system and the like. The RAM 33 functions as a working memory and temporarily stores various pieces of data needed for executing the various programs.

The communication device 34 is configured to be communicable with the arithmetic device 20. Communication between the communication device 34 and the arithmetic device 20 is executed using, for example, the Internet, a WAN, a LAN, Ethernet® network, a public network, a private network, a wired network, a wireless network, or a combination of these.

The storage device 35 includes, for example, a storage medium, such as a hard disk or a flash memory. The storage device 35 stores the output information 36 received from the arithmetic device 20. A place in which the output information 36 is stored is not limited to the storage device 35, and may be stored in, for example, the ROM 32.

Further, the communication device 34 is also configured to be communicable with the external device 50. The external device 50 may be, for example, an information processing terminal belonging to a business operator or a user who desires to disclose the SOH of the battery 45. The external device 50 may be, for example, a desktop-type personal computer (PC), a laptop-type PC, a tablet terminal, a smartphone, or other information processing terminals having a communication function. The external device 50 may be, for example, a device belonging to a secondary user who runs a battery recycling business.

The external device 50 designates the battery ID and requests the disclosure server 30 to disclose the SOH of the battery specified by the battery ID. In response to the request, the control device 31 reads the output information 36 including the requested battery ID from the storage device 35, and discloses the read output information 36 (the SOH) to the external device 50.

As above, the data management server 100 appropriately discloses the output information 36 (the SOH), but does not disclose the arithmetic formula 27 and the battery information 17 excluding the battery ID to the disclosure server 30 and the external device 50 outside the company A. For example, even when the arithmetic formula 27 is hidden, in a case where the SOH and the battery information 17 which is original data for deriving the SOH are disclosed, the arithmetic formula 27 may be inferred. In the same manner, even when the battery information 17 is hidden, in a case where the SOH and the arithmetic formula 27 are disclosed, the battery information 17 may be inferred. By hiding the arithmetic formula 27 and the battery information 17 excluding the battery ID, it is possible to appropriately hide the arithmetic formula 27. Further, when the battery information 17 itself is stored in the BLC data 16 in order to restrict the tampering of the battery information 17, the battery information 17 is disclosed to the data management devices 10A of the company B, the company C, and the company D. By storing the hash value of the battery information 17 in the BLC data 16, it is also possible to hide the battery information 17 from the data management devices 10A of the company B, the company C, and the company D while ensuring the tamper resistance of the battery information 17.

Functional Block

Figure 5:
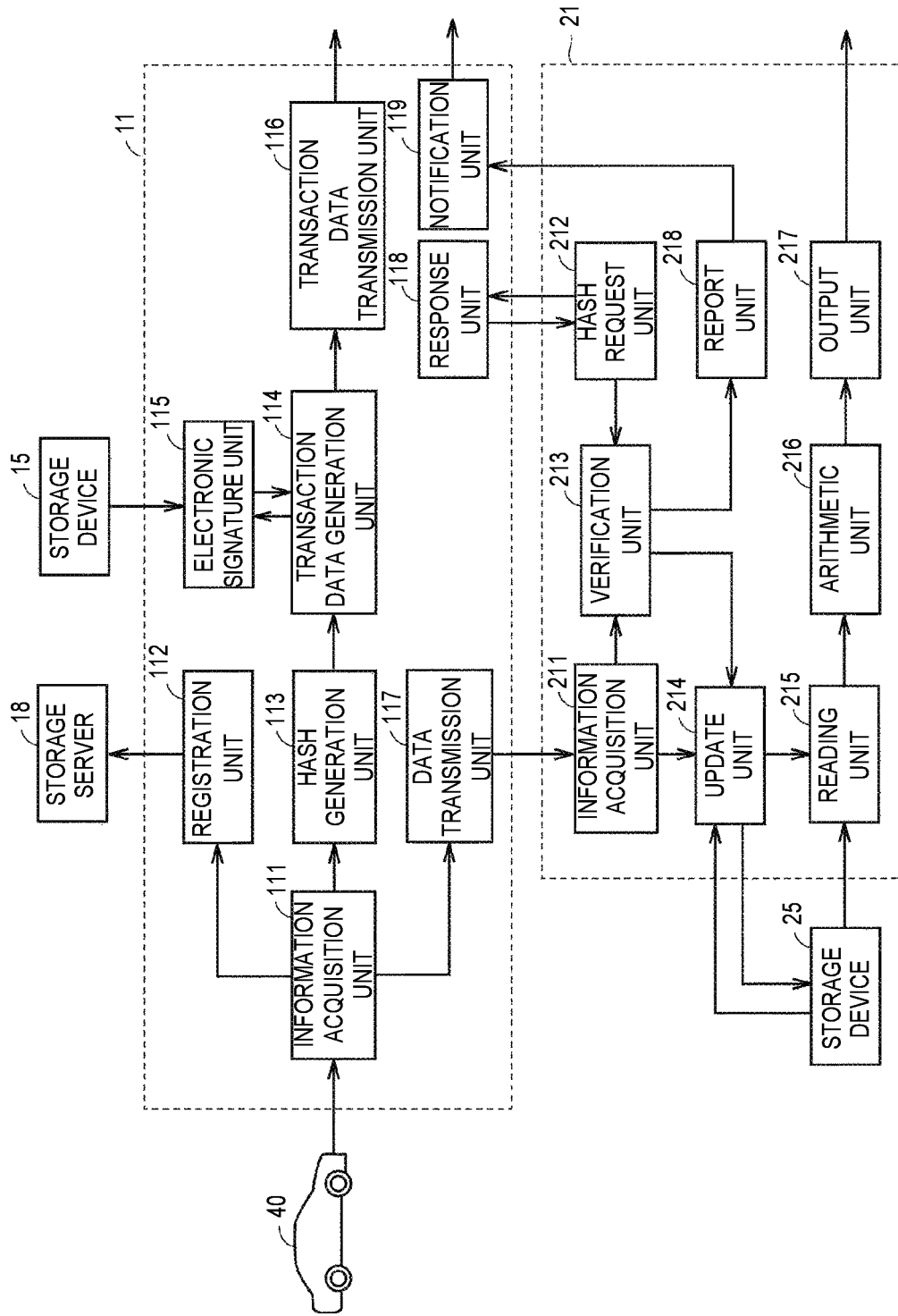
FIG. 5 is a functional block diagram of a control device of a data management device, and a control device of an arithmetic device.

FIG. 5 is a functional block diagram of the control device 11 of the data management device 10, and the control device 21 of the arithmetic device 20. With reference to FIG. 5, the control device 11 of the data management device 10 includes an information acquisition unit 111, a registration unit 112, a hash generation unit 113, a transaction data generation unit 114, an electronic signature unit 115, a transaction data transmission unit 116, a data transmission unit 117, a response unit 118, and a notification unit 119. By, for example, executing the program stored in the ROM 12, the control device 11 functions as the information acquisition unit 111, the registration unit 112, the hash generation unit 113, the transaction data generation unit 114, the electronic signature unit 115, the transaction data transmission unit 116, the data transmission unit 117, the response unit 118, and the notification unit 119. The functions of the information acquisition unit 111, the registration unit 112, the hash generation unit 113, the transaction data generation unit 114, the electronic signature unit 115, the transaction data transmission unit 116, the data transmission unit 117, the response unit 118, and the notification unit 119 may be implemented by, for example, dedicated hardware (an electronic circuit).

The information acquisition unit 111 acquires the battery information 17 from the vehicle 40 via the communication device 14. Upon acquiring the battery information 17, the information acquisition unit 111 outputs the acquired battery information 17 to the registration unit 112, the hash generation unit 113, and the data transmission unit 117.

The registration unit 112 stores the battery information 17 received from the information acquisition unit 111 in the storage device 18. Specifically, the registration unit 112 specifies the battery ID from the battery information 17. Then, the registration unit 112 outputs, to the storage device 18, a control signal for accumulating the battery information 17 in time series for each battery ID.

The hash generation unit 113 hashes the battery information 17 received from the information acquisition unit 111 using the hash function, and generates a hash value (hereinafter, also referred to as "a battery hash") of the battery information 17. The hash generation unit 113 outputs the battery hash to the transaction data generation unit 114.

The transaction data generation unit 114 generates the transaction data to be transmitted to the blockchain network NW1. More specifically, the transaction data generation unit 114 generates transaction data for including the battery hash received from the hash generation unit 113 in the BLC data 16.

Further, the transaction data generation unit 114 receives an electronic signature from the electronic signature unit 115. The transaction data generation unit 114 includes the electronic signature in the transaction data.

The electronic signature unit 115 reads the private key from the storage device 15. The electronic signature unit 115 encrypts the battery hash using the private key and generates an electronic signature. The electronic signature unit 115 outputs the generated electronic signature to the transaction data generation unit 114.

The transaction data generation unit 114 includes the electronic signature in the transaction data. Further, the transaction data generation unit 114 includes the battery ID corresponding to the battery hash, the above-described time information, and the transmitter information in the transaction data. Then, the transaction data generation unit 114 outputs the transaction data to the transaction data transmission unit 116.

The transaction data transmission unit 116 outputs, to the communication device 14, a control signal for transmitting the transaction data to the blockchain network NW1. As such, the transaction data is transmitted to the blockchain network NW1 via the communication device 14.

The data transmission unit 117 outputs, to the communication device 14, a control signal for transmitting the battery information 17 received from the information acquisition unit 111 to the arithmetic device 20. As such, the battery information 17 is transmitted to the arithmetic device 20 via the communication device 14.

The response unit 118 receives, from the arithmetic device 20 (specifically, a hash request unit 212 described below), a transmission request for the hash value (the battery hash) of the battery information 17 transmitted by the data transmission unit 117. The response unit 118 specifies the transaction data that has stored the battery hash, which is a target of the request, based on, for example, the battery ID corresponding to the battery hash, which is the target of the request. Then, the response unit 118 extracts the transaction data that has stored a target battery hash from the BLC data 16, based on, for example, the transaction ID of the specified transaction data. The response unit 118 acquires a battery hash from the extracted transaction data, and replies to the arithmetic device 20 (the hash request unit 212) with the acquired battery hash.

When inconsistency of the data has been detected in verification processing described below in the arithmetic device 20, the notification unit 119 receives a report indicating that the inconsistency has been detected from the arithmetic device 20 (specifically, a report unit 218 described below). Details will be described below, but when the inconsistency of the data has been detected in the verification processing, the battery information 17 may have been tampered with. Therefore, upon receiving the report indicating that the inconsistency has been detected (indicating that the battery information 17 may have been tampered with), the notification unit 119 outputs, to a notification device (not shown), a notification indicating that tampering may have occurred. The notification device includes, for example, a display device and/or a voice output device, and executes a warning display by the display device and/or a warning by the voice output device.

The control device 21 of the arithmetic device 20 includes an information acquisition unit 211, a hash request unit 212, a verification unit 213, an update unit 214, a reading unit 215, an arithmetic unit 216, an output unit 217, and the report unit 218. The control device 21 functions as the information acquisition unit 211, the hash request unit 212, the verification unit 213, the update unit 214, the reading unit 215, the arithmetic unit 216, the output unit 217, and the report unit 218 by, for example, executing the program stored in the ROM 22. The functions of the information acquisition unit 211, the hash request unit 212, the verification unit 213, the update unit 214, the reading unit 215, the arithmetic unit 216, the output unit 217, and the report unit 218 may be implemented by, for example, dedicated hardware (an electronic circuit).

The information acquisition unit 211 acquires the battery information 17 from the data management device 10 (the data transmission unit 117). The information acquisition unit 211 outputs the acquired battery information 17 to the verification unit 213 and the update unit 214. Upon acquiring the battery information 17, the information acquisition unit 211 transmits a notification indicating the acquisition to the hash request unit 212.

The hash request unit 212 requests the data management device 10 (the response unit 118) to transmit the hash value (the battery hash) of the battery information 17, which is stored in the BLC data 16 and acquired by the information acquisition unit 211. The hash request unit 212 acquires the battery hash as a response to the request from the data management device 10 (the response unit 118). The hash request unit 212 outputs the acquired battery hash to the verification unit 213.

The verification unit 213 executes verification processing for confirming consistency between the battery information 17 acquired by the information acquisition unit 211 from the data management device 10 and the battery hash acquired by the hash request unit 212 from the data management device 10. Specifically, the verification unit 213 hashes the battery information 17 acquired by the information acquisition unit 211 from the data management device 10 using the hash function. Then, the verification unit 213 compares the hashed hash value with the battery hash acquired by the hash request unit 212 from the data management device 10. When both pieces of data match each other, the verification unit 213 determines that both pieces of data are consistent with each other and the battery information 17 has not been tampered with (tampering not detected). On the other hand, when both pieces of data do not match each other, the verification unit 213 determines that both pieces of data are inconsistent with each other and the battery information 17 may have been tampered with (tampering detected). The verification unit 213 outputs a result of the verification processing to the update unit 214 and the report unit 218. When tampering has not been detected, the verification unit 213 may output the result of the verification processing to the update unit 214, and when tampering has been detected, it may output the result of the verification processing to the report unit 218. When the verification unit 213 determines that the battery information 17 may have been tampered with, the battery information 17 is discarded without updating the arithmetic information 26 using the battery information 17.

Upon receiving a result indicating that tampering has not been detected from the verification unit 213, the update unit 214 updates the arithmetic information 26 by adding the battery information 17 received from the information acquisition unit 211 to the arithmetic information 26 stored in the storage device 25. The update unit 214 outputs, to the reading unit 215, a notification indicating that the arithmetic information 26 has been updated. On the other hand, upon receiving the result indicating that tampering has been detected from the verification unit 213, the update unit 214 discards the battery information 17 without updating the arithmetic information 26.

The reading unit 215 reads the arithmetic information 26 and the arithmetic formula 27 from the storage device 25. The reading unit 215 outputs the read arithmetic information 26 and the arithmetic formula 27 to the arithmetic unit 216.

The arithmetic unit 216 calculates the SOH of the battery 45 using the arithmetic information 26 and the arithmetic formula 27. The arithmetic unit 216 outputs the calculated SOH to the output unit 217.

The output unit 217 creates the output information 36 including the SOH information received from the arithmetic unit 216 and the battery ID for specifying the battery 45. Then, the output unit 217 outputs, to the communication device 24, a control signal for transmitting the output information 36 to the disclosure server 30. As such, the output information 36 is transmitted to the disclosure server 30 via the communication device 24.

Upon receiving the result indicating that tampering has been detected from the verification unit 213, the report unit 218 reports, to the data management device 10 (the notification unit 119), a notification indicating that the battery information 17 may have been tampered with.

Flowchart

Figure 6:
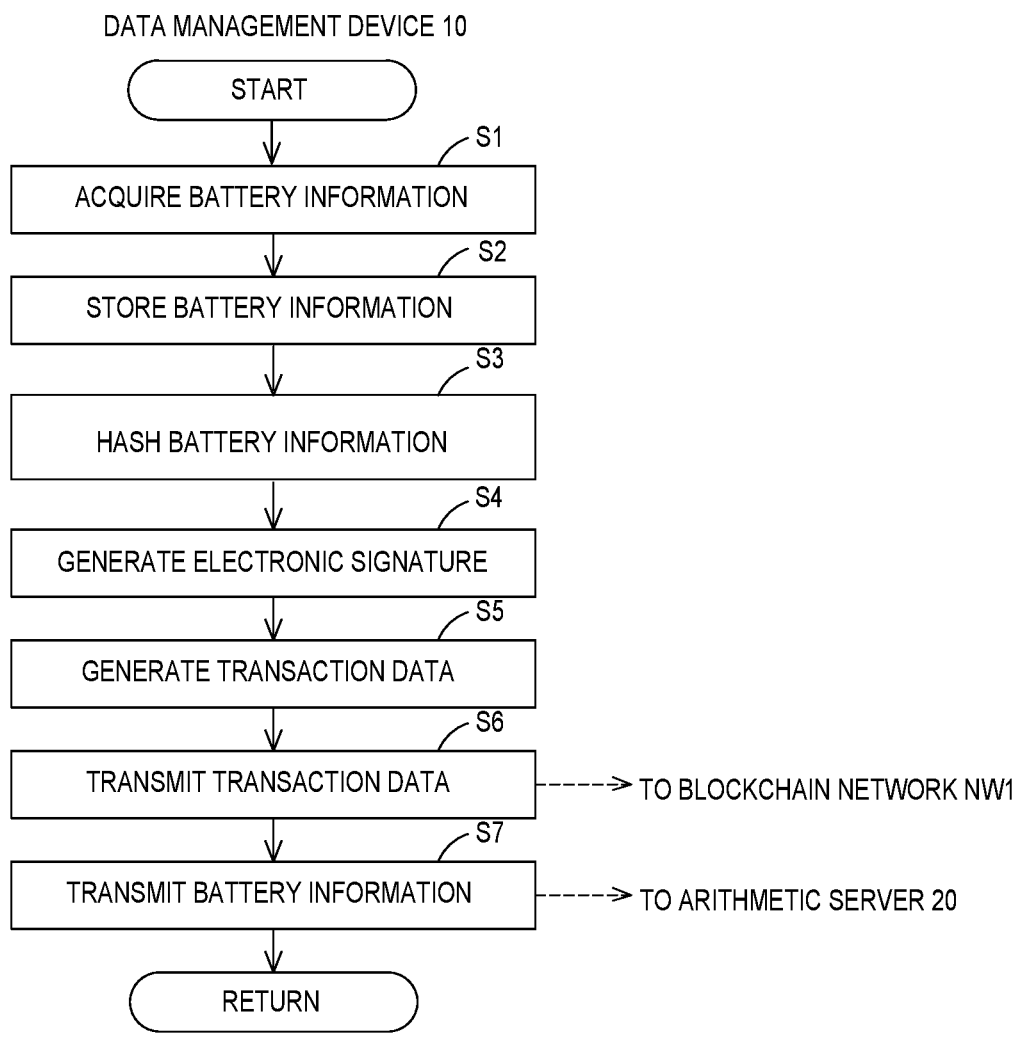
FIG. 6 is a flowchart illustrating procedures of processing executed in the data management device.

FIG. 6 is a flowchart illustrating procedures of processing executed in the data management device 10. The processing of the flowchart illustrated in FIG. 6 is executed by the control device 11 of the data management device 10 at every predetermined cycle. Each step (hereinafter, the step is abbreviated as "S") of the flowchart illustrated in FIG. 6 describes a case where the processing is implemented by software processing by the control device 11, but a part or all of the processing may be implemented by hardware (an electronic circuit) manufactured in the control device 11.

In S1, the control device 11 acquires the battery information 17 from the vehicle 40. In a case where the vehicle 40 is configured not to output the battery information 17 during the sleep time, when the battery information 17 is not transmitted because the vehicle 40 is in a sleep state, the processing is returned.

In S2, the control device 11 stores the battery information 17 acquired in S1 in the storage device 18. The storage device 18 stores the battery information 17 in time series for each battery ID according to the control signal from the control device 11.

In S3, the control device 11 hashes the battery information 17 acquired in S1 using the hash function and generates a battery hash.

In S4, the control device 11 reads the private key from the storage device 15. Then, the control device 11 encrypts the battery hash generated in S3 using the private key and generates an electronic signature.

In S5, the control device 11 generates the transaction data including the battery hash and the electronic signature. In addition to the above, the control device 11 includes, in the transaction data, the battery ID corresponding to the battery hash, the time information for broadcasting the transaction data to the blockchain network NW1 (it may be the time information indicating an occurrence time of the processing corresponding to the transaction data), and the transmitter information of the transaction data.

In S6, the control device 11 outputs, to the communication device 14, a control signal for transmitting the generated transaction data to the blockchain network NW1. As such, the transaction data is transmitted to the blockchain network NW1 via the communication device 14.

In S7, the control device 11 outputs, to the communication device 14, a control signal for transmitting the battery information 17 acquired in S1 to the arithmetic device 20. As such, the battery information 17 is transmitted to the arithmetic device 20 via the communication device 14.

Figure 7:
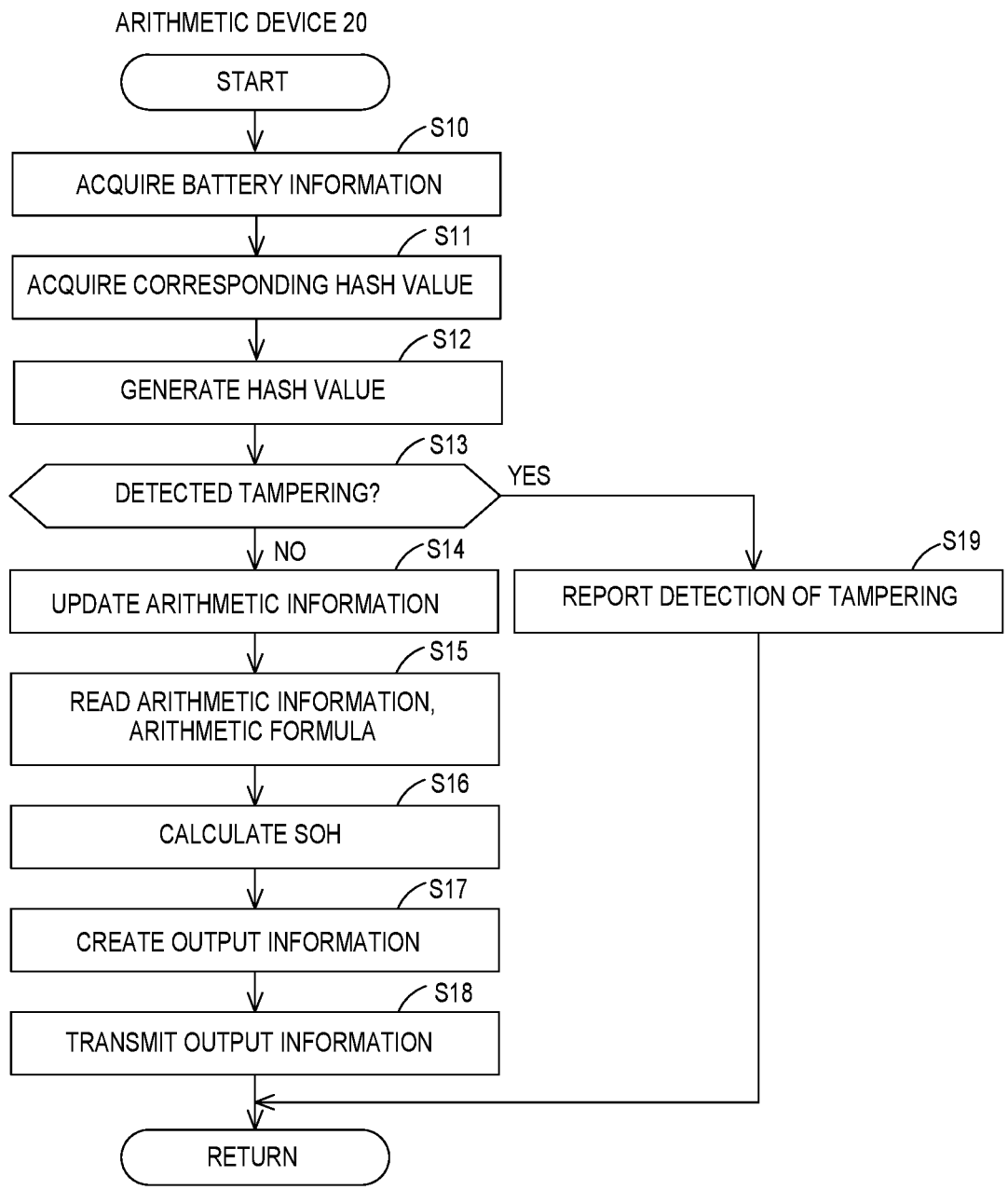
FIG. 7 is a flowchart illustrating procedures of processing executed in the arithmetic device.

FIG. 7 is a flowchart illustrating procedures of processing executed in the arithmetic device 20. The processing of the flowchart illustrated in FIG. 7 is executed by the control device 21 of the arithmetic device 20 at every predetermined cycle. Each step of the flowchart illustrated in FIG. 7 describes a case where the processing is implemented by software processing by the control device 21, but a part or all of the processing may be implemented by hardware (an electronic circuit) manufactured in the control device 21.

In S10, the control device 21 acquires the battery information 17 from the data management device 10. In the case where the vehicle 40 is configured not to output the battery information 17 during the sleep time, when the battery information 17 is not transmitted from the data management device 10 because the vehicle 40 is in the sleep state, the processing is returned.

In S11, the control device 21 requests the data management device 10 to transmit the hash value (the battery hash) of the battery information 17, which is stored in the BLC data 16 and acquired in S10, and acquires the battery hash from the data management device 10.

In S12, the control device 21 hashes the battery information 17 acquired in S10 using the hash function and generates a hash value.

In S13, the control device 21 compares the battery hash acquired in S11 with the hash value hashed in S12, and determines whether both pieces of data match each other, that is, whether the battery information 17 acquired in S10 may have been tampered with. When both pieces of data match each other, the control device 21 determines that the battery information 17 acquired in S10 has not been tampered with (NO in S13), and the process proceeds to S14. On the other hand, when both pieces of data do not match each other, the control device 21 determines that the battery information 17 acquired in S10 may have been tampered with (YES in S13), and the process proceeds to S19.

In S14, the control device 11 updates the arithmetic information 26 by adding the battery information 17 acquired in S10 to the arithmetic information 26 stored in the storage device 25.

In S15, the control device 11 reads the arithmetic information 26 updated in S14 and the arithmetic formula 27 from the storage device 25.

In S16, the control device 11 calculates the SOH of the battery 45 using the arithmetic information 26 and the arithmetic formula 27 that are read in S15.

In S17, the control device 11 creates the output information 36 including the SOH information calculated in S16 and the battery ID for specifying the battery 45.

In S18, the control device 11 outputs, to the communication device 24, a control signal for transmitting the output information 36 to the disclosure server 30. As such, the output information 36 is transmitted to the disclosure server 30 via the communication device 24.

In S19, the control device 11 reports, to the data management device 10, a notification indicating that the battery information 17 may have been tampered with.

As above, in the data management system 1 according to the first embodiment, the data management server 100 receives the battery information 17 from the vehicle 40 and calculates the SOH of the battery 45 using the arithmetic information 26 where the battery information 17 is accumulated in time series and the arithmetic formula 27. Then, the data management server 100 offers the SOH to the disclosure server 30, but does not offer the arithmetic formula 27 and the battery information 17 excluding the battery ID to the disclosure server 30. For example, even when the arithmetic formula 27 is hidden, in a case where the SOH and the battery information 17, which is original data for deriving the SOH, are disclosed, the arithmetic formula 27 may be inferred. By hiding the arithmetic formula 27 and the battery information 17 excluding the battery ID, it is possible to appropriately hide the arithmetic formula 27. In other words, with the data management system 1 according to the first embodiment, it is possible to appropriately hide the arithmetic formula 27 that the company A desires to hide from the outside of the company A while appropriately disclosing the SOH, which is information that is a target of disclosure according to the regulation or the like.

Further, blockchain-based software is installed in the data management device 10 of the data management server 100. When the blockchain-based software functions, the data management device 10 functions as a node and forms the blockchain network NW1 together with the data management device 10A belonging to another company. The data management device 10 generates transaction data including a battery hash obtained by hashing the battery information 17 acquired from the vehicle 40 and transmits the transaction data to the blockchain network NW1. By storing the battery hash in the BLC data 16, it is possible to improve the tamper resistance of the battery information 17. Therefore, it is possible to improve the reliability of the SOH of the battery 45 calculated using the battery information 17.

Further, when the battery information 17 itself is stored in the BLC data 16, the battery information 17 is disclosed to the data management devices 10A of the company B, the company C, and the company D. By storing the hash value of the battery information 17 in the BLC data 16, it is also possible to hide the battery information 17 from the data management devices 10A of the company B, the company C, and the company D while ensuring the tamper resistance of the battery information 17.

In the above, the configuration where both the arithmetic formula 27 and the battery information 17 excluding the battery ID are hidden from the disclosure server 30 has been described. However, a configuration where at least one of the arithmetic formula 27 and the battery information 17 excluding the battery ID is hidden from the disclosure server 30 can also be employed. For example, when the arithmetic formula 27 is hidden, the arithmetic formula 27 is hidden from the disclosure server 30. Generally, in order to analyze the arithmetic formula 27 from the SOH and the battery information 17, highly advanced analysis processing is needed. Therefore, when at least one of the arithmetic formula 27 and the battery information 17 excluding the battery ID is not offered to the disclosure server 30, the hidden information can be hidden unless it is intentionally analyzed using the highly advanced analysis processing. In the first embodiment, by hiding both the arithmetic formula 27 and the battery information 17 excluding the battery ID, for example, even when an intentional analysis using the highly advanced analysis processing is executed, it is possible to restrict the hidden information from being analyzed using the analysis.

Modified Example 1

In the first embodiment, an example where the index indicating the state of the battery is the SOH has been described. However, the index indicating the state of the battery is not limited to the SOH. The index indicating the state of the battery may be, for example, an internal resistance value, impedance, a full charging capacity, or a capacity retention rate of the battery 45. A modified example 1 can also be combined with modified examples 2 to 4 and a second embodiment that are described below.

Modified Example 2

In the data management system 1 according to the first embodiment, an example where the blockchain-based software is installed in the data management server 100, which forms the blockchain network NW1 together with the data management device 10A belonging to another company, and information (the battery information 17) is managed has been described. However, other distributed ledger techniques can also be applied instead of the distributed ledger technique using the blockchain. For example, a distributed ledger technique using a directed acyclic graph (DAG) may be applied. Specifically, as a distributed ledger base installed in the data management server 100, for example, CORDA® or Scalar DLT may be employed. The modified example 2 can also be combined with the above-described modified example 1, and modified examples 3 and 4, and the second embodiment that are described below.

Modified Example 3

In the first embodiment, when the data management device 10 acquires the battery information 17 from the vehicle 40, the arithmetic information 26 of the arithmetic device 20 is updated, and the SOH of the battery 45 is calculated using the updated arithmetic information 26 and the arithmetic formula 27. However, each time the arithmetic device 20 calculates the SOH, it stores the time TIME1 during which the battery 45 is maintained at a certain temperature and the time TIME2 during which the battery 45 is maintained at a certain SOC, and, upon receiving new battery information 17, the arithmetic device 20 may calculate the SOH from the arithmetic formula 27 by updating the stored time TIME1 and the time TIME2 from the battery information 17.

Second Embodiment

In the data management system 1 according to the first embodiment, the data management server 100 is provided such that the battery information 17 output from the vehicle 40 is not directly input to the disclosure server 30. Then, in the data management system 1 according to the first embodiment, the battery information 17 output from the vehicle 40 is used in calculating the SOH of the battery 45 in the data management server 100 of the company A, and the calculated SOH is transmitted to the disclosure server 30. As such, information (for example, the SOH) that is obliged to be disclosed is disclosed, but information (the arithmetic formula 27 or the battery information 17 for calculating the SOH) that is not obliged to be disclosed is hidden from the outside of the company A. In the second embodiment, a data management system 2 which hides the information that is not obliged to be disclosed from the external device 50 without providing the data management server 100 will be described. The configurations already described in the first embodiment are denoted by the same reference signs, and description thereof will not be repeated.

Figure 8:
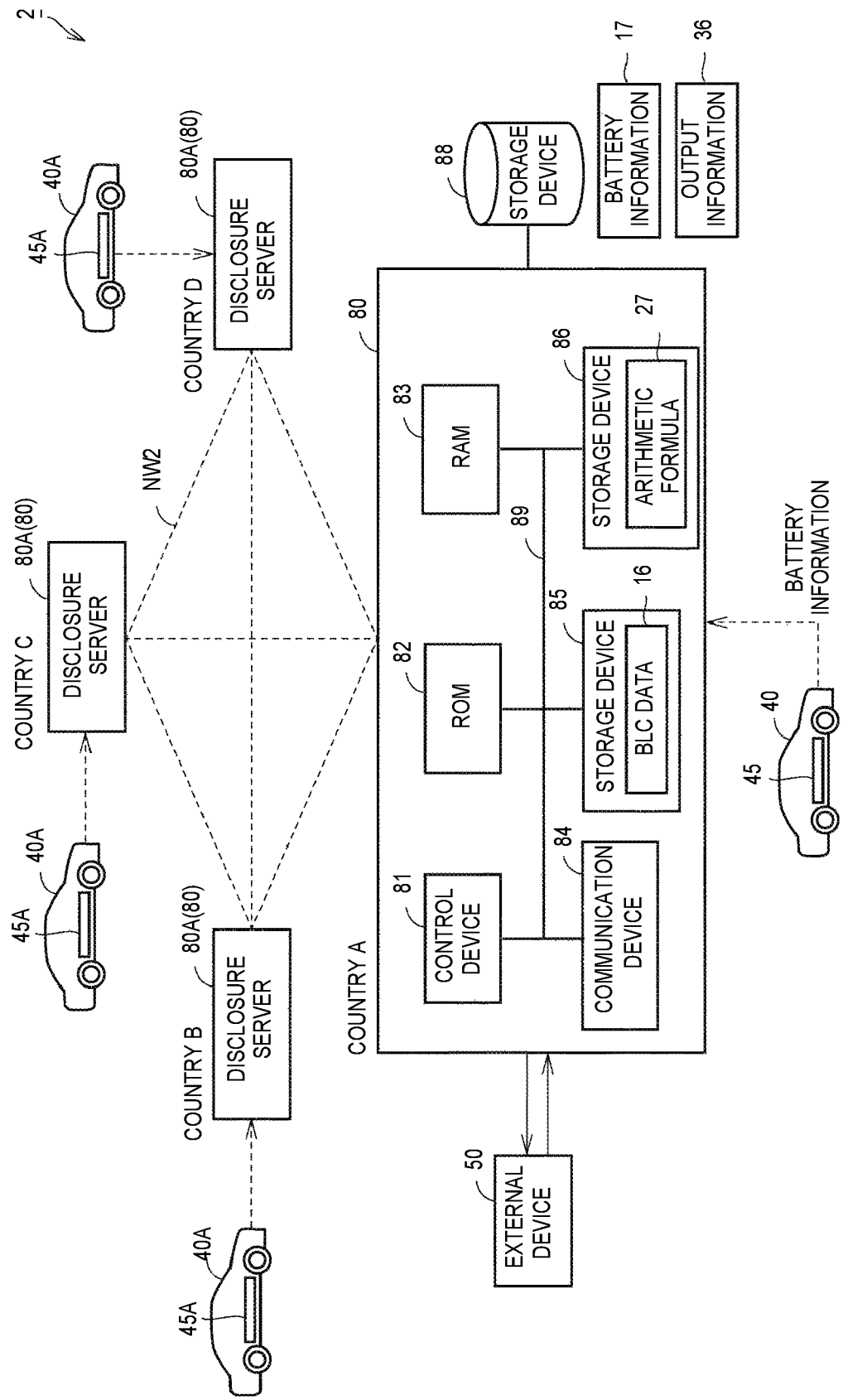
FIG. 8 is a diagram illustrating a schematic configuration of a data management system according to a second embodiment.

FIG. 8 is a diagram illustrating a schematic configuration of the data management system 2 according to the second embodiment. The data management system 2 includes four disclosure servers 80. The four disclosure servers 80 may be, for example, servers belonging to different countries (for example, a country A, a country B, a country C, and a country D). In FIG. 8, the disclosure server 80 in the country A is referred to as a disclosure server 80, and the disclosure servers 80 in the countries B, C, D are referred to as disclosure servers 80A.

Each of the countries A, B, C, D is obliged to disclose an index indicating the state of the battery according to a regulation or the like of each country. In the same manner as in the first embodiment, in the second embodiment, an example where the index indicating the state of the battery is the SOH will be described. The disclosure server 80 receives the battery information 17 from a vehicle 40 existing in the country A. In the same manner, the disclosure server 80A in the country B receives the battery information 17 from a vehicle 40A existing in the country B, and the disclosure server 80A in the country C receives the battery information 17 from a vehicle 40A existing in the country C, and the disclosure server 80A in the country D receives the battery information 17 from a vehicle 40A existing in the country D. The disclosure servers 80, 80A calculate the SOHs of the batteries 45, 45A and disclose these to the external device 50. In the data management system 2 according to the second embodiment, by setting a storage area that stores information as a layered structure, storage layers of disclosed information and hidden information are divided, and the hidden information is hidden from the outside. Hereinafter, the disclosure server 80 of the company A will be typically described, but the disclosure servers 80A also have the same function. According to the present disclosure, the disclosure server 80 corresponds to an example of "a disclosure server that manages data of a battery mounted on a vehicle using a distributed ledger technique and discloses an index indicating a state of the battery".

The disclosure server 80 includes a control device 81, a ROM 82, a RAM 83, a communication device 84, a storage device 85, and a storage device 86. The control device 81, the ROM 82, the RAM 83, the communication device 84, the storage device 85, and the storage device 86 are connected to the bus 89. Further, a storage device 88 is communicably connected to the disclosure server 80. Further, blockchain-based software is installed in the disclosure server 80, and the disclosure server 80 functions as a node in the blockchain network when the installed blockchain-based software functions.

The control device 81 is composed of, for example, an integrated circuit including a CPU. The control device 81 develops, in the RAM 83, various programs stored in the ROM 82 and executes them. The various programs include an operating system and the like. The RAM 83 functions as a working memory and temporarily stores various pieces of data needed for executing the various programs.

The communication device 84 is configured to be communicable with the vehicle 40. Further, the communication device 14 is configured to be communicable with the disclosure server 80A. Communication between the communication device 84, and the vehicle 40 or the disclosure server 80A is executed using, for example, the Internet, a WAN, a LAN, Ethernet® network, a public network, a private network, a wired network, a wireless network, or a combination of these.

The control device 81 stores, in the storage device 88, the battery information 17 received from the vehicle 40 via the communication device 84. The storage area that stores information of the storage device 88 has a plurality of layers. The control device 81 designates a layer that stores the battery information 17, and outputs a control signal for storing the battery information 17 in the designated layer. The storage device 88 stores the newly received battery information 17 according to a control signal from the disclosure server 80 (the control device 81). In the same manner as the storage device 18 according to the first embodiment, the storage device 88 stores the battery information 17 for each battery ID included in the battery information 17 in time series. The storage device 88 can also be provided as a storage device in the disclosure server 80.

FIG. 9 is a diagram schematically illustrating the storage area of the storage device 88. The storage device 88 has a structure with a plurality of layers. In FIG. 9, the storage device 88 has three layers, that is, a first layer to a third layer. The number of layers included in the storage device 88 is not limited to 3, and may be, for example, 2, or equal to or higher than 4.

Pieces of authority information different from each other are set in the first to the third layers. In the second embodiment, the pieces of authority information of a first rank, a second rank, and a third rank are set in the first layer, the second layer, and the third layer, respectively. The first rank is a level at which information is disclosed in response to a disclosure request that designates a battery ID. The second rank is a level at which information is disclosed in response to a disclosure request that designates a battery ID, from a specific business operator. The specific businesses operator includes a business operator who uses, manufactures, and/or recycles a battery. The third rank is a level at which information is disclosed in response to a disclosure request that designates a battery ID, from a certification organization. The certification organization certifies a notified business operator as a specific business operator.

In the second embodiment, the storage device 88 stores the output information 36 in the first layer. The storage device 88 stores the battery information 17 in the second layer. The storage device 88 may further store, in the second layer, composition information of the battery 45, the information of each component composing the battery 45, contact information of a supplier, disassembly information of the battery 45, and the like. The storage device 88 stores, in the third layer, technical information, such as a test result or a test report, at the time of manufacturing the battery 45.

With reference to FIG. 8 again, each of the disclosure servers 80, 80A manages data by the distributed ledger technique using the blockchain. The four disclosure servers 80, 80A form a blockchain network NW2. Each of the disclosure servers 80, 80A stores the BLC data 16. The BLC data 16 stores information including a hash value of the battery information 17 transmitted by the disclosure servers 80, 80A to the blockchain network NW2 from a start of an operation of the data management system 2 to the present. Further, the BLC data 16 may store information including a hash value (disassembly information) of other data (output information 36, technical information, composition information of the battery 45, information of each component composing the battery 45, contact information of the supplier, disassembly information of the battery 45, and the like) stored in the storage device 88.

The storage device 85 includes, for example, a storage medium, such as a hard disk or a flash memory. The storage device 85 stores the BLC data 16. A place in which the BLC data 16 is stored is not limited to the storage device 85, and may be stored in, for example, the ROM 82, the storage device 86, or the storage device 88.

Further, the storage device 85 stores the private key and the public key generated by the control device 81. The storage device 85 may store an electronic certificate issued by an authentication authority (not shown). The applicant for the electronic certificate (the disclosure server 80 in the second embodiment) generates the private key and the public key, and transmits the generated public key to the authentication authority. The authentication authority generates the electronic certificate for the public key received from the applicant and issues the electronic certificate to the applicant. Alternatively, the authentication authority may generate the private key, the public key, and the electronic certificate in response to a request from the applicant (the disclosure server 80 in the second embodiment), and issue these to the applicant. The authentication authority issues, for example, information of the public key by including it in the electronic certificate. The control device 81 executes, for example, processing for applying for and acquiring the electronic certificate when participating in the blockchain network NW2 for the first time. Further, the storage device 85 stores the electronic certificate of the disclosure server 80A that forms the blockchain network NW2. A place in which the private key, the public key, the electronic certificate, and the electronic certificate of the disclosure server 80A are stored is not limited to the storage device 85, and may be stored in, for example, the ROM 82, the storage device 86 or the storage device 88.

The storage device 86 includes, for example, a storage medium, such as a hard disk or a flash memory. The storage device 86 stores the arithmetic formula 27. The information stored in the storage device 86 is not disclosed to the outside of the disclosure server 80. A place in which the arithmetic formula 27 is stored is not limited to the storage device 86, and may be stored in, for example, the ROM 82 or the storage device 88. When the arithmetic formula 27 is stored in the storage device 88, for example, the storage device 88 may store the arithmetic formula 27 in the second layer or the third layer. The second layer and the third layer of the storage device 86 and the storage device 88 correspond to an example of the "second layer of the storage device" according to the present disclosure.

Upon acquiring the battery information 17 from the vehicle 40, the control device 81 stores the battery information 17 in the storage device 88 and generates a hash value of the battery information 17. The control device 81 generates transaction data including the generated hash value, and transmits the generated transaction data to the blockchain network NW2. By adding this transaction data to the block, the hash value (the battery hash) of the battery information 17 is stored in the BLC data 16.

Functional Block

Figure 10:
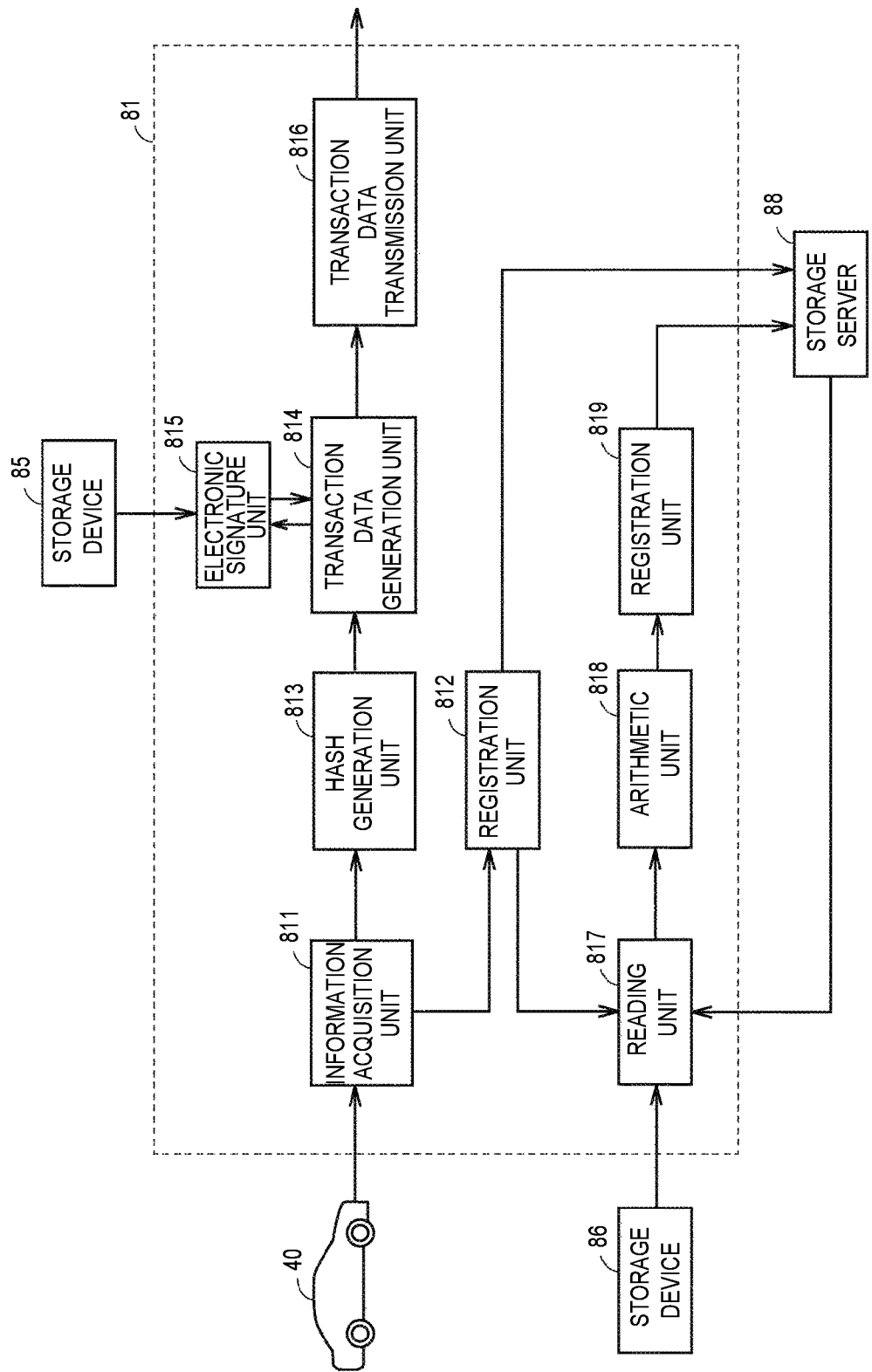
FIG. 10 is a functional block diagram of a control device of a disclosure server.

FIG. 10 is a functional block diagram of the control device 81 of the disclosure server 80. With reference to FIG. 10, the control device 81 of the disclosure server 80 includes an information acquisition unit 811, a registration unit 812, a hash generation unit 813, a transaction data generation unit 814, an electronic signature unit 815, a transaction data transmission unit 816, a reading unit 817, an arithmetic unit 818, and a registration unit 819. By, for example, executing the program stored in the ROM 82, the control device 81 functions as the information acquisition unit 811, the registration unit 812, the hash generation unit 813, the transaction data generation unit 814, the electronic signature unit 815, the transaction data transmission unit 816, the reading unit 817, the arithmetic unit 818, and the registration unit 819. The functions of the information acquisition unit 811, the registration unit 812, the hash generation unit 813, the transaction data generation unit 814, the electronic signature unit 815, the transaction data transmission unit 816, the reading unit 817, the arithmetic unit 818, and the registration unit 819 may be implemented by, for example, dedicated hardware (an electronic circuit).

The information acquisition unit 811 acquires battery information 17 from the vehicle 40 via the communication device 84. Upon acquiring the battery information 17, the information acquisition unit 811 outputs the acquired battery information 17 to the registration unit 812 and the hash generation unit 813. The hash generation unit 813, the transaction data generation unit 814, the electronic signature unit 815, and the transaction data transmission unit 816 have the same functions as the hash generation unit 113, the transaction data generation unit 114, and the electronic signature unit 115, the transaction data transmission unit 116 according to the first embodiment, respectively, and thus description thereof will not be repeated.

The registration unit 812 stores the battery information 17 received from the information acquisition unit 811 in a designated layer in the storage device 88. Specifically, the registration unit 812 outputs, to the storage device 88, a control signal for designating the second layer as a place in which the battery information 17 is stored. In more detail, the registration unit 812 specifies the battery ID from the battery information 17 received from the information acquisition unit 811, and outputs, to the storage device 88, a control signal for accumulating the battery information 17 in the second layer in time series for each battery ID. Upon ending storing the battery information 17 in the storage device 88, the registration unit 812 outputs a notification indicating the end to the reading unit 817.

The reading unit 817 collects and reads the battery information 17 including the battery ID of the battery 45 accumulated in time series from the storage device 88 based on the battery ID, and reads the arithmetic formula 27 from the storage device 86. Hereinafter, the collected and read battery information 17 (including the battery ID of the battery 45) is also referred to as a "battery information group". The reading unit 817 outputs the read battery information group and the arithmetic formula 27 to the arithmetic unit 818.

The arithmetic unit 818 calculates the SOH of the battery 45 using the battery information group and the arithmetic formula 27. The arithmetic unit 818 outputs the calculated SOH to the registration unit 819.

The registration unit 819 creates the output information 36 including SOH information received from the arithmetic unit 818 and the battery ID for specifying the battery 45. Then, the registration unit 819 designates a layer that stores the output information 36 and stores the layer in the storage device 88. Specifically, the registration unit 819 outputs, to the storage device 88, a control signal for designating the first layer as a place in which the output information 36 is stored. Upon having already stored the output information 36 including the battery ID of the battery 45, the storage device 88 overwrites the already stored output information 36 with the newly received output information 36.

Flowchart

Figure 11:
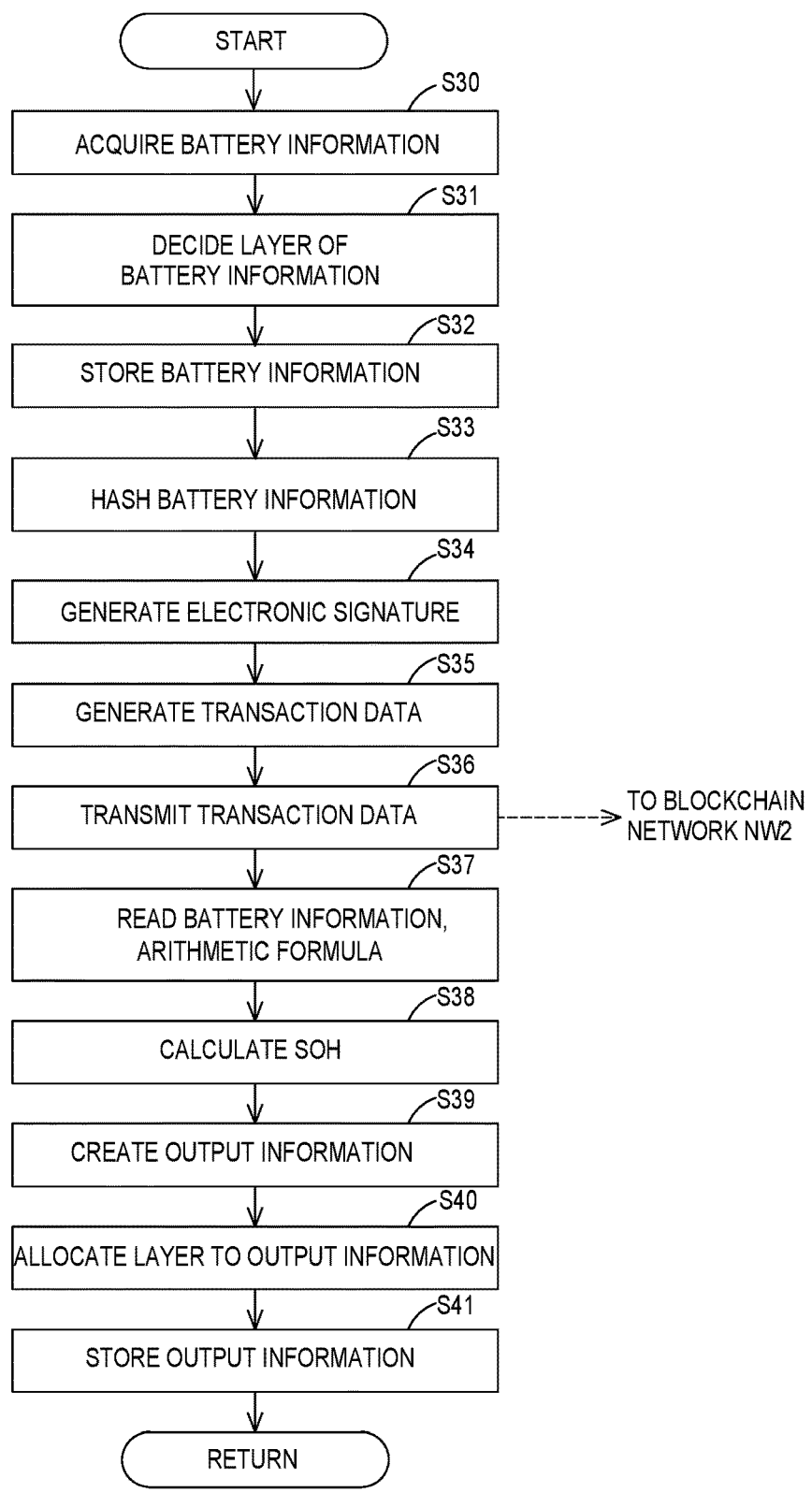
FIG. 11 is a flowchart illustrating procedures of processing executed in the disclosure server.

FIG. 11 is a flowchart illustrating procedures of processing executed in the disclosure server 80. The processing of the flowchart illustrated in FIG. 11 is executed by the control device 81 of the disclosure server 80 at every predetermined cycle. Each step of the flowchart illustrated in FIG. 11 describes a case where the processing is implemented by software processing by the control device 81, but a part or all of the processing may be implemented by hardware (an electronic circuit) manufactured in the control device 81.

In S30, the control device 81 acquires the battery information 17 from the vehicle 40. In a case where the vehicle 40 is configured not to output the battery information 17 during the sleep time, when the battery information 17 is not transmitted because the vehicle 40 is in a sleep state, the processing is returned.

In S31, the control device 81 decides a layer of the storage device 88 that stores the battery information 17 acquired in S30. Specifically, the control device 81 decides the layer of the storage device 88 that stores the information based on the type of information. Since a target to be stored is the battery information 17, the control device 81 decides to store the information (the battery information 17) in the second layer of the storage device 88.

In S32, the control device 81 stores the battery information 17 acquired in S30 in the second layer of the storage device 88. The storage device 88 stores, in the second layer, the battery information 17 in time series for each battery ID according to the control signal from the control device 11.

In S33, the control device 81 hashes the battery information 17 acquired in S30 using the hash function and generates a battery hash.

In S34, the control device 81 reads the private key from the storage device 85. Then, the control device 81 encrypts the battery hash generated in S33 using the private key and generates an electronic signature.

In S35, the control device 81 generates transaction data including the battery hash and the electronic signature. In addition to the above, the control device 81 includes, in the transaction data, the battery ID corresponding to the battery hash, the time information (it may be the time information indicating an occurrence time of the processing corresponding to the transaction data) for broadcasting the transaction data to the blockchain network NW2, and the transmitter information of the transaction data.

In S36, the control device 81 outputs, to the communication device 84, a control signal for transmitting the generated transaction data to the blockchain network NW2. As such, the transaction data is transmitted to the blockchain network NW2 via the communication device 84.

In S37, the control device 81 collects and reads, from the storage device 88, the battery information 17 (the battery information group) including the battery ID of the battery 45 accumulated in the storage device 88 in time series, and reads the arithmetic formula 27 from the storage device 86.

In S38, the control device 81 calculates the SOH of the battery 45 using the battery information group and the arithmetic formula 27 read in S37.

In S39, the control device 81 creates the output information 36 including the SOH information calculated in S38 and the battery ID for specifying the battery 45.

In S40, the control device 11 decides a layer of the storage device 88 that accumulates the output information 36 created in S39. Specifically, the control device 81 decides the layer of the storage device 88 that stores the information based on the type of information. Since a target to be stored is the output information 36, the control device 81 decides to store the information (the output information 36) in the first layer of the storage device 88.

In S41, the control device 81 stores the output information 36 in the first layer of the storage device 88. The storage device 88 stores the output information 36 in the first layer according to the control signal from the control device 11.

As above, in the data management system 2 according to the second embodiment, the disclosure server 80 receives the battery information 17 from the vehicle 40. The storage device 88 connected to the disclosure server 80 has three layers, that is, the first to the third layers in which settings of the pieces of authority information are different from each other in the storage area. The disclosure server 80 stores the battery information 17 received from the vehicle 40 in the second layer in which a disclosure range is limited to a specific business operator. Then, the disclosure server 80 calculates the SOH from the battery information 17 (the battery information group) and the arithmetic formula 27 stored in the storage device 86, and stores the calculated SOH (the output information 36) in the first layer of the storage device 88. Since the SOH is stored in the first layer that discloses information in response to a disclosure request that designates the battery ID, it is possible to appropriately disclose the SOH, which is the information that is obliged to be disclosed according to the regulation or the like. On the other hand, since the arithmetic formula 27 can be estimated from the input (the battery information 17) and the output (the SOH), by storing the input (the battery information 17) in the second layer of the storage device 88 and the arithmetic formula 27 in the storage device 86, it is possible to appropriately hide the arithmetic formula 27. Therefore, it is possible to restrict the arithmetic formula 27 from being known to the outside of the company A (excluding the disclosure server 80). By storing the battery information 17 in the third layer, the input (the battery information 17) may also be hidden from a specific business operator.

Further, in the same manner as the data management device 10 according to the first embodiment, the blockchain-based software is installed in the disclosure server 80. When the blockchain-based software functions, the disclosure server 80 functions as a node and forms the blockchain network NW2 together with the disclosure server 80A. The disclosure server 80 generates transaction data including a battery hash obtained by hashing the battery information 17 acquired from the vehicle 40, and transmits the transaction data to the blockchain network NW2. By storing the battery hash in the BLC data 16, it is possible to improve the tamper resistance of the battery information 17. Therefore, it is possible to improve the reliability of the SOC of the battery 45 calculated using the battery information 17. Therefore, it is possible to improve the reliability of the SOC of the battery 45 calculated using the battery information 17.

Further, when the battery information 17 itself is stored in the BLC data 16, the battery information 17 is disclosed to the disclosure servers 80A of the country B, the country C, and the country D. By storing the hash value of the battery information 17 in the BLC data 16, it is also possible to hide the battery information 17 for the disclosure server 80A of the country B, the country C, and the country D while ensuring the tamper resistance of the battery information 17.

Modified Example 4

In the first and the second embodiments and the modified examples 1 to 3, the data management systems 1, 2 manage and disclose the index indicating the state of the batteries mounted on the vehicle. However, the indices managed and disclosed in the data management systems 1, 2 are not limited to the batteries mounted on the vehicle. The data management systems 1, 2 can apply indices indicating states of various batteries to management and disclosure. The data management systems 1, 2 can also apply an index indicating states of a stationary batteries to management and disclosure. Further, the data management systems 1, 2 can also apply indices indicating states of a plurality of types of batteries, such as indices indicating states of batteries mounted on the vehicle and indices indicating states of stationary batteries, to management and disclosure.

The embodiment disclosed herein needs to be considered as illustrative in all points and not restrictive. The scope of the present disclosure is shown not by the above description of the embodiments but by the claims, and is intended to include meanings equivalent to the claims and all modifications within the scope thereof.

What is claimed is:

1. A data management system that offers an index indicating a state of a battery to a disclosure server that discloses the index, the data management system comprising:

a data management device configured to acquire battery data and store, in a distributed ledger, transaction data including information on the acquired battery data and a hash value obtained by hashing the acquired battery data; and an arithmetic device configured to:
- acquire the battery data from the data management device and calculate the index using the battery data and a predetermined arithmetic formula; and
- upon acquiring the battery data from the data management device, compare the hash value obtained by hashing the acquired battery data with the information on the battery data stored in the distributed ledger, determine whether there is a match between the hash value obtained by hashing the acquired battery data and the information on the battery data, when there is a match, the arithmetic device is configured to offer the index to the disclosure server, the battery data and the predetermined arithmetic formula are hidden from the disclosure server, when there is not a match, determine a tampering of the information on the battery data, the arithmetic device is configured to discard the information on the battery data and the data management device is configured to generate a notification and transmit the notification to an external device, the notification indicating the tampering of the information on the battery data, in response, the external device executes a warning display by a display of the external device or a warning by a voice output of the external device.

2. The data management system according to claim 1, further comprising:
a storage device configured to accumulate the battery data in time series,
wherein the arithmetic device is configured to calculate the index using the battery data accumulated in the storage device and the predetermined arithmetic formula.

3. The data management system according to claim 1, further comprising the disclosure server.

4. A disclosure server that manages battery data using a distributed ledger technique, and discloses an index indicating a state of a battery, the disclosure server comprising:
a storage device having a storage area including a first layer that stores disclosable data and a second layer that stores hidden data; and
a control device,
wherein the control device is configured to:
acquire the battery data;
store, in a distributed ledger, transaction data including information on the battery data and a hash value obtained by hashing the battery data;
calculate the index using the battery data and a predetermined arithmetic formula;
store the index in the first layer;
store the battery data and the predetermined arithmetic formula in the second layer;
upon acquiring the battery data from a data management device, compare the hash value obtained by hashing the acquired battery data with the information on the battery data stored in the distributed ledger, and
determine whether there is a match between the hash value obtained by hashing the acquired battery data and the information on the battery data,
when there is a match, offer the index to the disclosure server, the battery data and the predetermined arithmetic formula are hidden from the disclosure server,
when there is not a match, determine a tampering of the information on the battery data, discard the information on the battery data, generate a notification, and instruct the data management device to transmit the notification to an external device, the notification indicating the tampering of the information on the battery data, in response, the external device executes a warning display by a display of the external device or a warning by a voice output of the external device.

5. The disclosure server according to claim 4, wherein:
the storage device is configured to store the battery data in the second layer in time series; and
the control device is configured to calculate the index using the battery data and the predetermined arithmetic formula accumulated in the second layer.

6. A method that is executed by a processor and offers an index indicating a state of a battery to a disclosure server that discloses the index, the method comprising:
acquiring, by the processor, battery data;
storing, by the processor, transaction data including information on the acquired battery data in a distributed ledger, and a hash value obtained by hashing the battery data;
upon acquiring the battery data from a data management device, comparing the hash value obtained by hashing the acquired battery data with the information on the battery data stored in the distributed ledger; and
determining whether there is a match between the hash value obtained by hashing the acquired battery data and the information on the battery data,
when there is a match, calculating, by the processor, the index using the battery data and a predetermined arithmetic formula and offering the index to the disclosure server, the battery data and the predetermined arithmetic formula are hidden from the disclosure server,
when there is not a match, determining a tampering of the information on the battery data, discarding the information on the battery data, generating a notification and transmitting the notification to an external device, the notification indicating the tampering of the information on the battery data, in response, the external device executes a warning display by a display of the external device or a warning by a voice output of the external device.

* * * * *